US012787791B2

(12) United States Patent
Jung et al.

(10) Patent No.: US 12,787,791 B2
(45) Date of Patent: Nov. 3, 2026

(54) SEMICONDUCTOR DEVICE AND METHOD OF FORMING SELECTIVE SHIELDING USING UV CURABLE INK

(71) Applicant: STATS ChipPAC Pte. Ltd., Singapore (SG)

(72) Inventors: JinHee Jung, Incheon (KR); ChangOh Kim, Incheon (KR); WooSoon Kim, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 355 days.

(21) Appl. No.: 18/402,302

(22) Filed: Jan. 2, 2024

(65) Prior Publication Data

US 2025/0218985 A1 Jul. 3, 2025

(51) Int. Cl.

| | |
|---|---|
| ***H10W 44/20*** | (2026.01) |
| ***H10W 42/20*** | (2026.01) |
| ***H10W 72/00*** | (2026.01) |
| ***H10W 72/20*** | (2026.01) |
| ***H10W 72/30*** | (2026.01) |
| ***H10W 74/00*** | (2026.01) |
| ***H10W 90/00*** | (2026.01) |

(52) U.S. Cl.

CPC ........... *H10W 44/20* (2026.01); *H10W 42/20* (2026.01); *H10W 90/00* (2026.01); *H10W 44/209* (2026.01); *H10W 44/248* (2026.01); *H10W 72/0198* (2026.01); *H10W 72/221* (2026.01); *H10W 72/225* (2026.01); *H10W 72/252* (2026.01); *H10W 72/344* (2026.01); *H10W 72/352* (2026.01); *H10W 74/00* (2026.01)

(58) Field of Classification Search

None

See application file for complete search history.

(56) References Cited

U.S. PATENT DOCUMENTS

| | | | | |
|---|---|---|---|---|
| 2017/0077039 | A1* | 3/2017 | Liao | H10W 42/20 |
| 2019/0017173 | A1* | 1/2019 | Ohnishi | C23C 18/2086 |
| 2022/0157739 | A1 | 5/2022 | Lee et al. | |
| 2024/0021536 | A1 | 1/2024 | Kim et al. | |

OTHER PUBLICATIONS

Kim, ChangOh, STATS ChipPAC Pte. Ltd., "Semiconductor Device and Method of Forming EMI Shielding Material in Two-Step Process to Avoid Contaminating Electrical Connector", U.S. Appl. No. 17/812,339, filed Jul. 13, 2023.

* cited by examiner

*Primary Examiner* — Alexander G Ghyka

(74) *Attorney, Agent, or Firm* — Brian M. Kaufman; Robert D. Atkins; PATENT LAW GROUP

(57) ABSTRACT

A semiconductor device has a substrate and an electrical component disposed over a surface of the substrate. An antenna can be formed within the substrate. An encapsulant is deposited over the surface of the substrate. An ink material is deposited over the surface of the substrate. The ink material can be a curable epoxy. The ink material is formed as a straight wall, curved wall, stepped wall, stepped convex wall, and such. The ink material can be stacked with a first ink material deposited on the surface of the substrate and a second ink material deposited over the first ink material. A shielding material is disposed over the encapsulant with the ink material blocking progression of the shielding material. An electrical connector is disposed over the surface of the substrate outside the ink material to avoid contact with the shielding material.

23 Claims, 20 Drawing Sheets

SEMICONDUCTOR DEVICE AND METHOD OF FORMING SELECTIVE SHIELDING USING UV CURABLE INK

FIELD OF THE INVENTION

The present invention relates in general to semiconductor devices and, more particularly, to a semiconductor device and method of forming selective electromagnetic interference (EMI) shielding using ultraviolet (UV) curable ink material.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into an SiP module for higher density in a small space and extended electrical functionality. Within the SIP module, semiconductor die and IPDs are disposed on a substrate for structural support and electrical interconnect. An encapsulant is deposited over the semiconductor die, IPDs, and substrate. An electrical connector is disposed on the substrate for electrical communication between the electrical components and external devices. The SIP module is partially molded in that the encapsulant does not extend to the electrical connector. The electrical connector is freestanding on the substrate.

The SIP module includes high speed digital and RF electrical components, highly integrated for small size and low height, and operating at high clock frequencies. An electromagnetic shielding material is commonly conformally applied over the encapsulant. The electromagnetic shielding layer reduces or inhibits EMI, RFI, and other inter-device interference, for example as radiated by high-speed digital devices, from affecting neighboring devices within or adjacent to SIP module.

However, it is important that the electrical connector be kept free of spurious shielding material to avoid failures. The conformal application of EMI shielding material is difficult to control for partially molded devices, particularly with respect to the freestanding electrical connector. The conformal shielding material can readily invade the space around the electrical connector, and bleed into the connector's contacts causing electrical shorts, or discontinuity when attempting to mate with the connector. Attempts have been made to mask or tape off the electrical connector while forming the shielding material. In some applications, with tight component spacing, the mask and tape are difficult to reliably isolate the electrical connector and potentially can damage the electrical connector.

BRIEF DESCRIPTION OF THE DRAWINGS

FIGS. 2*a*-21 illustrate a process of forming selective shielding over an SiP module with cured ink material;

FIG. 7 illustrates selective shielding over an AiP module with cured ink material; and FIG. 8 illustrates a printed circuit board (PCB) with different types of packages disposed on a surface of the PCB.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
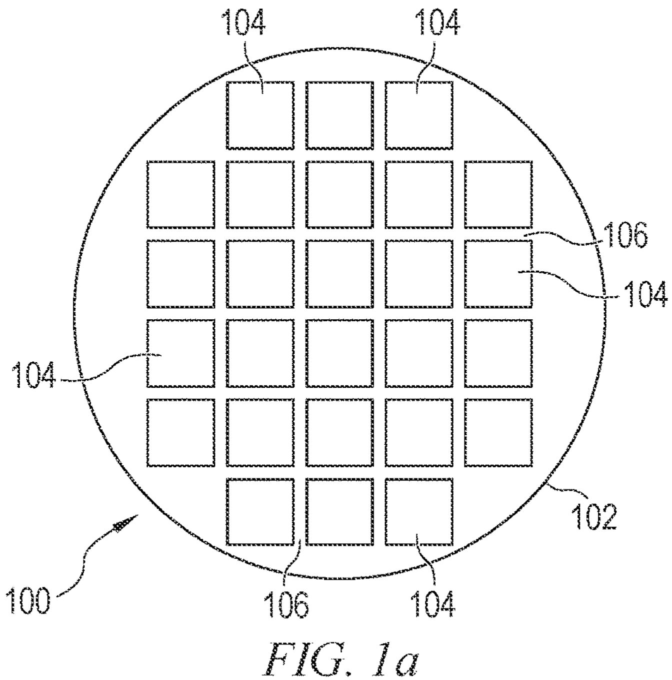
FIGS. 1*a*-1*c* illustrate a semiconductor wafer with a plurality of semiconductor die separated by a saw street.

FIG. 1*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
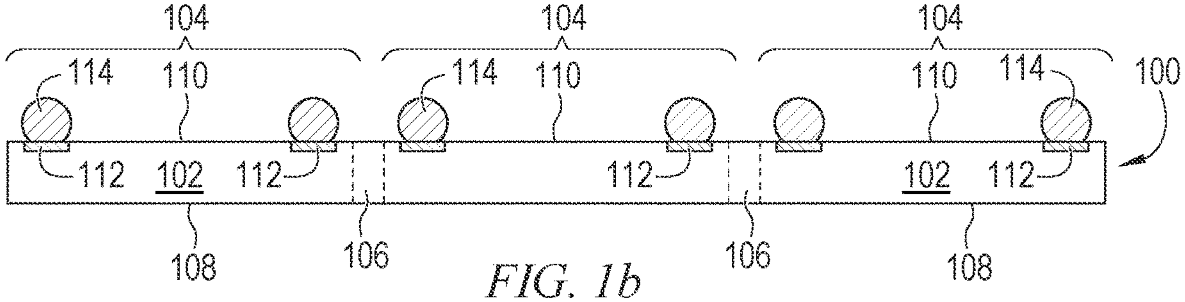

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
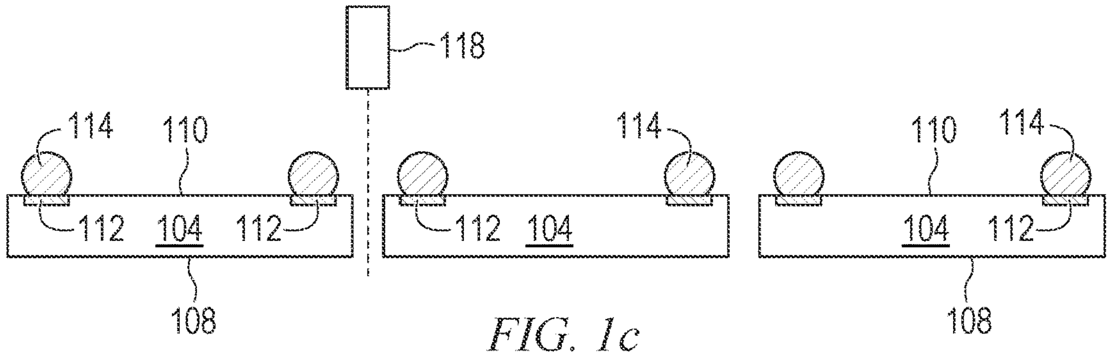

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figure 2A:
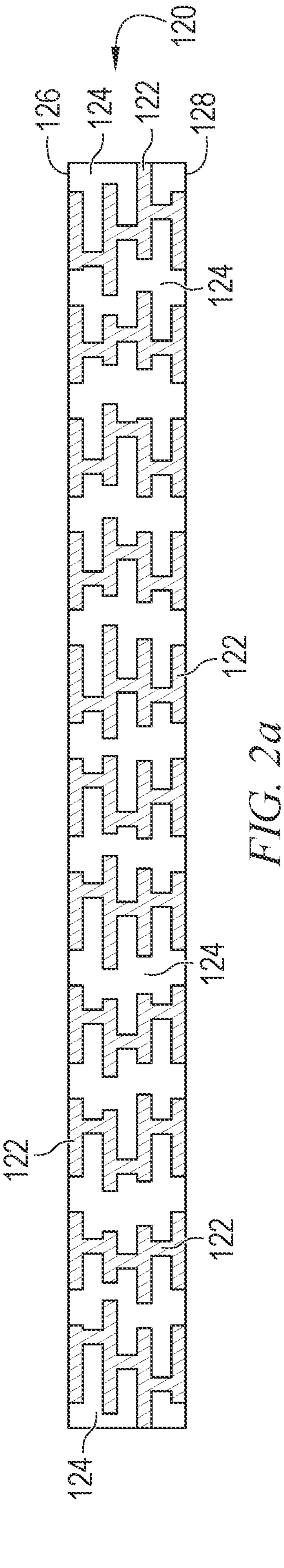

FIGS. 2*a*-21 illustrate a process of forming selective EMI shielding using UV curable ink. FIG. 2*a* shows a cross-sectional view of interconnect substrate 120 including conductive layers 122 and insulating layer 124. Conductive layer 122 can be one or more layers of Al, Cu, Sn, Ni, Au, Ag, or other suitable electrically conductive material. Conductive layers 122 can be formed using PVD, CVD, electrolytic plating, electroless plating process, or other suitable metal deposition process. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers 124 can be formed using PVD, CVD, printing, lamination, spin coating, spray coating, sintering or thermal oxidation. Insulating layer 124 provides isolation between conductive layers 122. There can be multiple conductive layers like 122 separated by insulating layers 124.

Figure 2B:
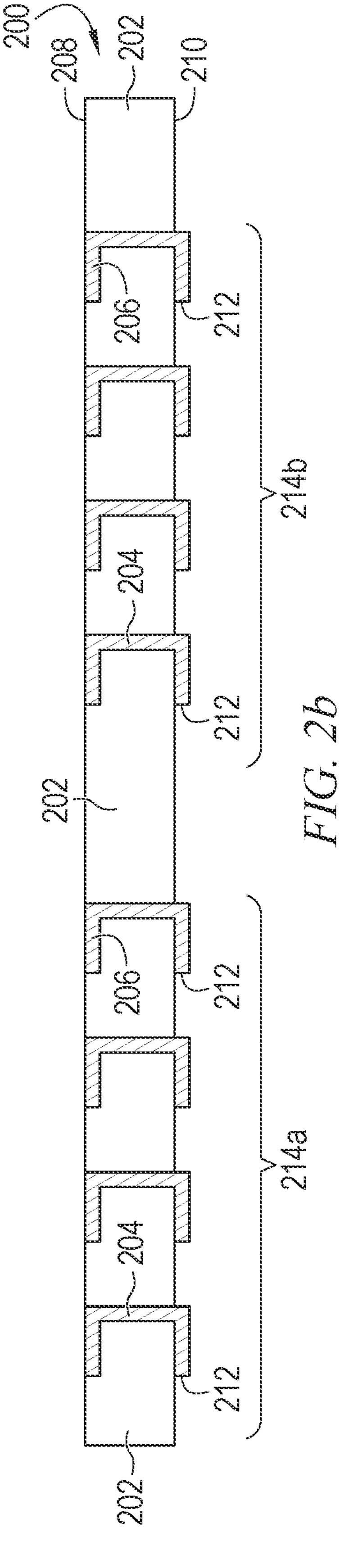

In another embodiment, a cross-sectional view of substrate 200 is shown including core material 202, as shown in FIG. 2*b*. Core material 202 can be silicon, germanium, aluminum phosphide, aluminum arsenide, gallium arsenide, gallium nitride, indium phosphide, silicon carbide, or other bulk material for structural support. Alternatively, core material 202 can be a multi-layer flexible laminate, ceramic, copper clad laminate (CCL), glass, or epoxy molding compound. Core material 202 may contain one or more layers of SiO2, Si3N4, SiON, Ta2O5, Al2O3, solder resist, prepreg, polyimide, polymer, BCB, PBO, and other material having similar insulating and structural properties. Conductive vias 204 are formed through core material 202 by forming vias through the core material and filling the vias with conductive material.

Conductive layer 206 is formed over or within surface 208. Conductive layer 206 can be one or more layers of Al, Cu, Sn, Ni, Au, Ag, or other suitable electrically conductive material. Conductive layer 206 can be formed using PVD, CVD, electrolytic plating, electroless plating process, or other suitable metal deposition process. Conductive layer 206 provides horizontal electrical interconnect across substrate 200. Portions of conductive layer 206 can be electrically common or electrically isolated depending on the design and function of semiconductor die 104 and other electrical components. Conductive layer 212 is formed over or within surface 210 of substrate 200 and electrically connected to conductive vias 204 and conductive layer 206. Conductive layer 212 can be one or more layers of Al, Cu, Sn, Ni, Au, Ag, or other suitable electrically conductive material. In one embodiment, conductive layer 212 operates as antenna area 214*a* and 214*b* to transmit and receive RF signals for later-mounted electrical components. The electrical components will be electrically connected to antenna areas 214*a*-214*b* by way of the vertical and horizontal segments of conductive layer 206 and conductive vias 204. Portions of conductive layers 212 can be electrically common or electrically isolated depending on the design and function of semiconductor die 104 and other electrical components. With antenna areas 214*a*-214*b*, substate 200 constitutes an AiP substrate.

Figure 2C:
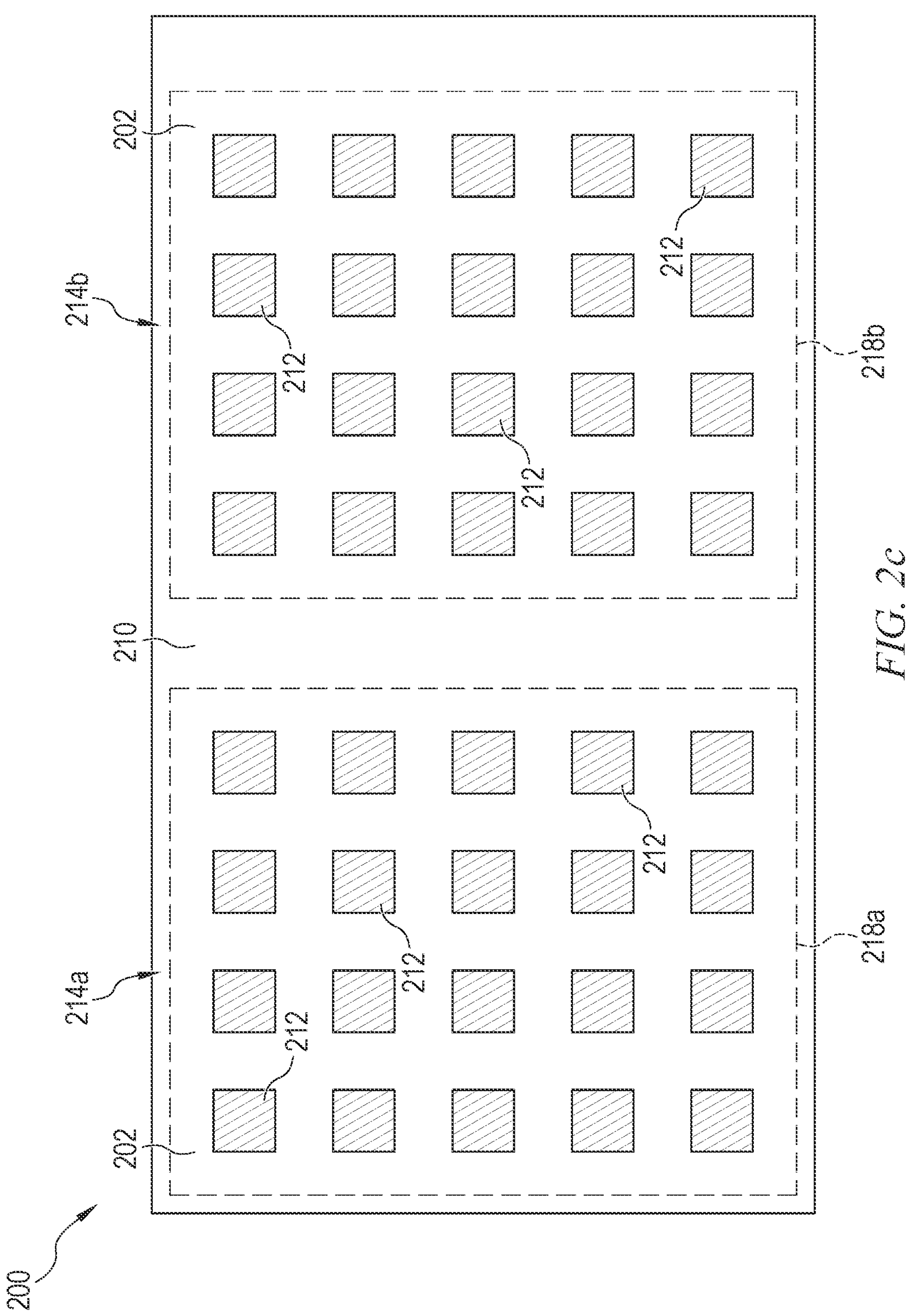

FIG. 2*c* is a top view of conductive layer 212 on surface 210 of AiP substrate 200. Conductive layer 212 includes an array of islands of conductive material suitable to provide transmission and reception of RF signals, i.e., an RF antenna. Conductive layer 212 operates as multiple RF antenna 218*a* and 218*b* exposed from surface 210 of AiP substrate 200. In particular, antenna areas 214*a*-214*b* of conductive layer 212 are exposed from surface 210 to improve RF transmission and reception performance and quality. In one embodiment, antenna area 214*a* with islands of conductive layer 212 serves as a first antenna 218*a* electrically connected through conductive layers 206 and conductive vias 204 to provide RF transmission and reception for a first electrical component. Antenna area 214*b* with islands of conductive layer 212 serves as a second antenna 218*b* electrically connected through conductive layer 206 and conductive vias 204 to provide RF transmission and reception for a second electrical component. AiP substrate 200 can have any number of RF antenna like 218*a*-218*b*.

Figure 2D:
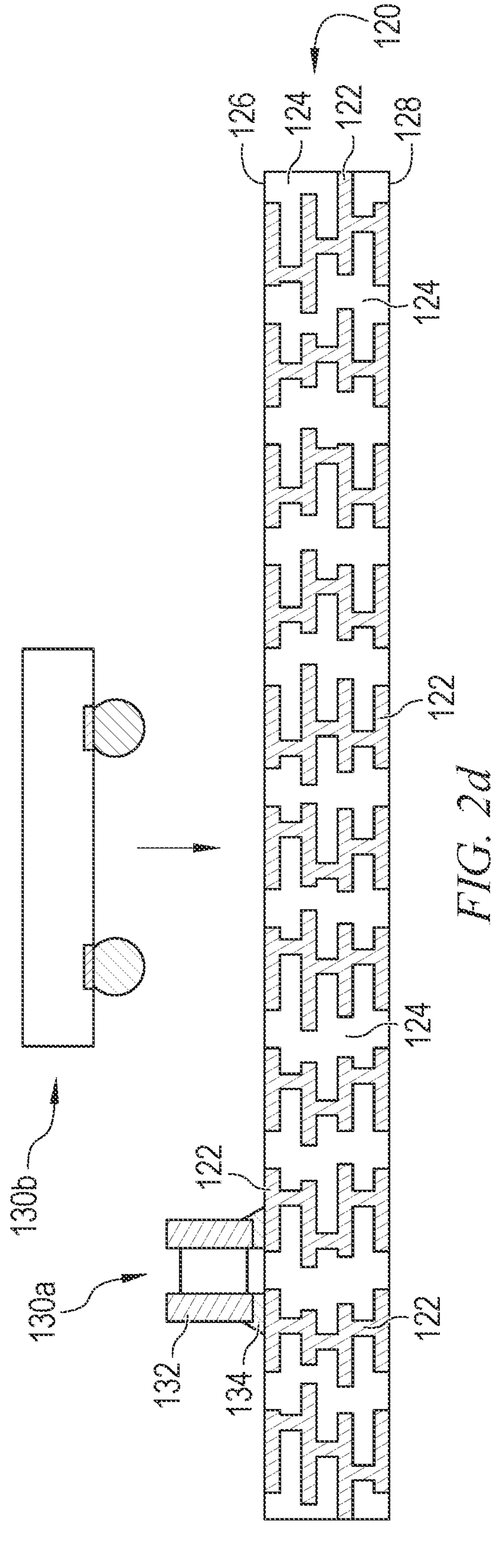

Continuing from FIG. 2*a*, a plurality of electrical components 130*a*-130*b* is disposed on surface 126 of interconnect substrate 120 and electrically and mechanically connected to conductive layers 122, as shown on a portion of interconnect substrate 120 in FIG. 2*d*. Electrical components 130*a*-130*b* are each positioned over substrate 120 using a pick and place operation. For example, electrical component 130*a* can be a discrete electrical device, or IPD, such as a diode, transistor, resistor, capacitor, and inductor, with terminals 132 disposed on surface 126 of interconnect substrate 120 and electrically and mechanically connected to conductive layers 122. Electrical component 130*b* can be similar to semiconductor die 104 from FIG. 1*c* with active surface 110 and bumps 114 oriented toward surface 126 of substrate 120. Alternatively, electrical components 130*a*-130*b* can include other semiconductor die, semiconductor packages, surface mount devices, discrete electrical devices, or IPDS.

Figure 2E:
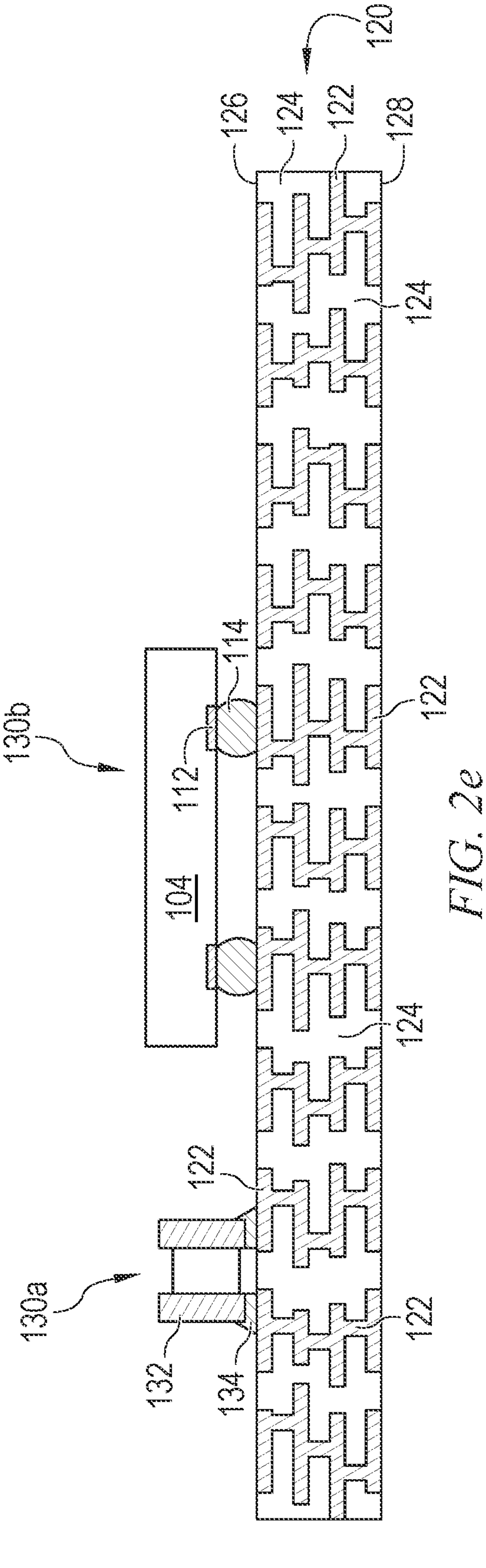

Electrical components 130*a*-130*b* are brought into contact with surface 126 of substrate 120. Conductive paste 134 bonds electrical components 130*a* to conductive layer 122. Bumps 114 are reflowed to mechanically and electrically connect electrical components 130*b* to conductive layer 122. FIG. 2*e* illustrates electrical components 130*a*-130*b* electrically and mechanically connected to conductive layers 122 of substrate 120.

Figure 2F:
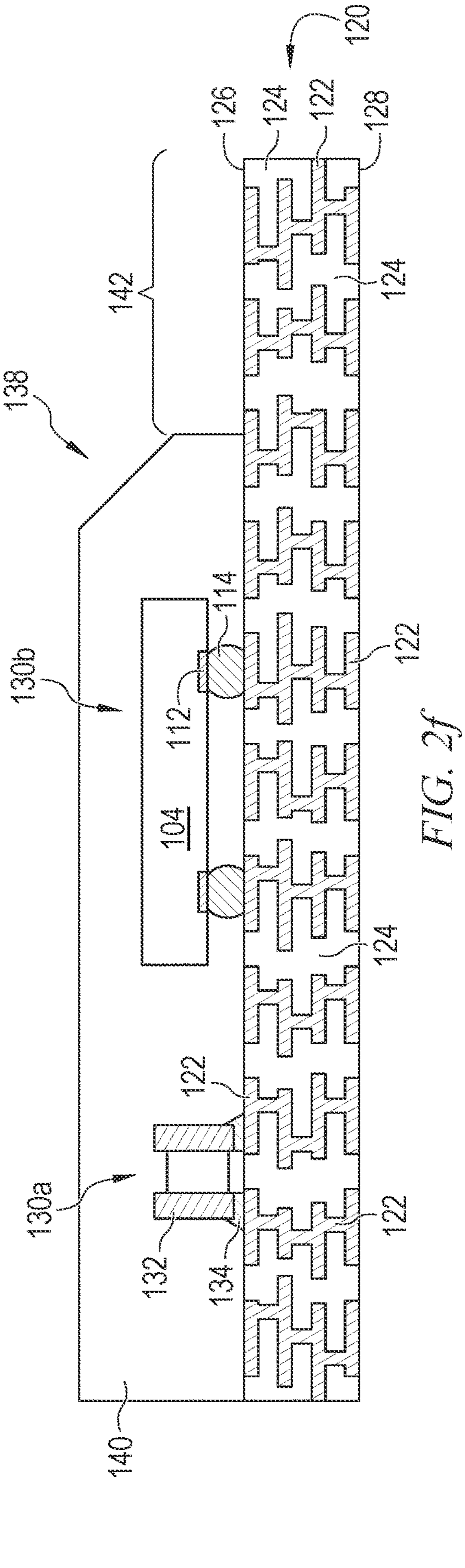

In FIG. 2*f*, an encapsulant or molding compound 140 is deposited over and around electrical components 130*a*-130*b* and substrate 120 using a paste printing, compressive molding, transfer molding, liquid encapsulant molding, vacuum lamination, spin coating, or other suitable applicator. Encapsulant 140 can be polymer composite material, such as epoxy resin with filler, epoxy acrylate with filler, or polymer with proper filler. Encapsulant 140 is non-conductive, provides structural support, and environmentally protects the semiconductor device from external elements and contaminants. The deposition of encapsulant 140 leaves an open area 142 of substrate 120, i.e., an area not occupied or covered by the encapsulant. The combination of substrate 120, encapsulant 140 covering electrical components 130*a*-130*b* constitutes assembly 138.

Figure 2G:
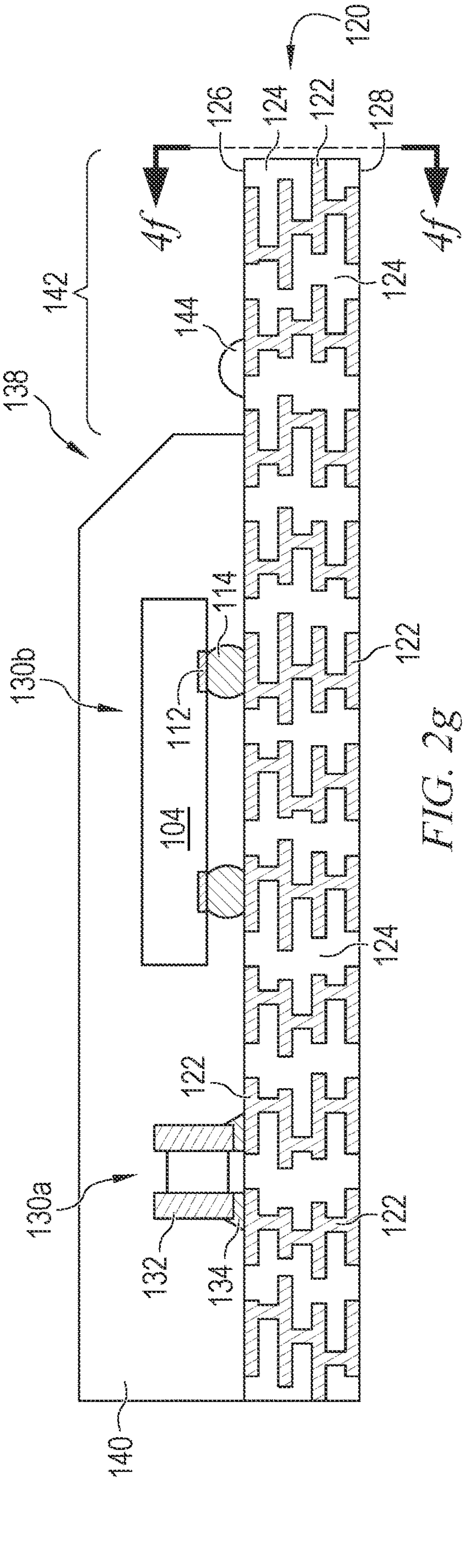
Figure 3B:
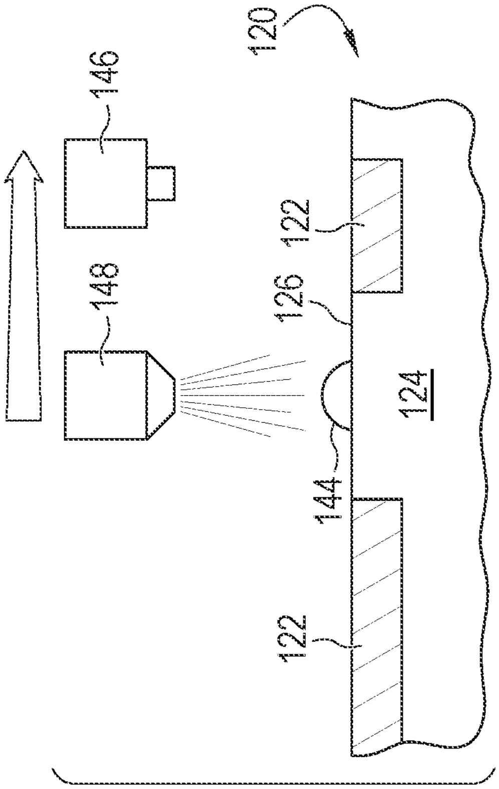
FIGS. 3*a*-3*c* illustrate application of the ink material.
Figure 3A:
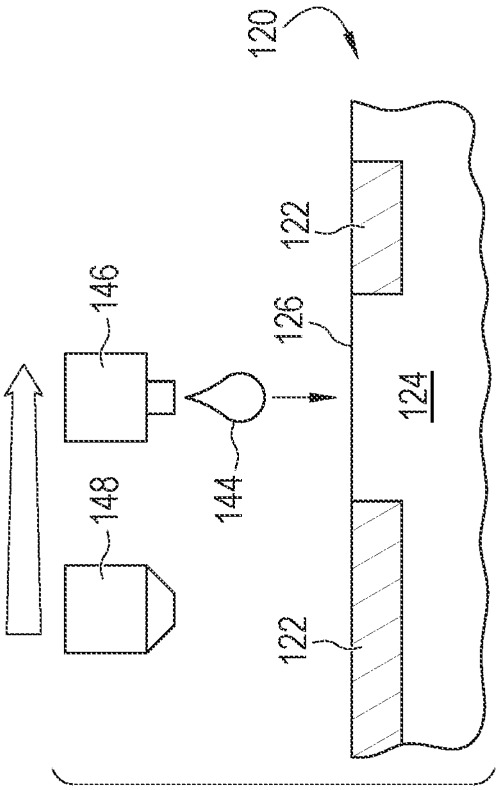
Figure 3C:
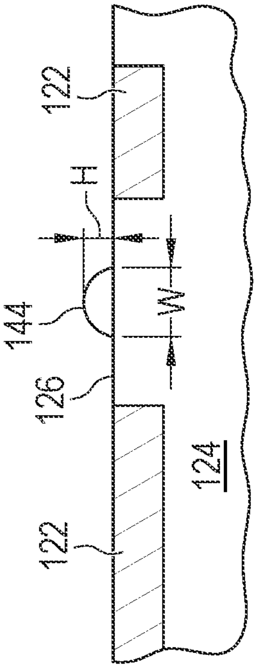

In FIG. 2*g*, a curable ink material 144 is deposited within open area 142. FIG. 3*a* shows further detail of a portion of open area 142 of substrate 120. Dispenser 146 deposits droplets of liquid ink material 144 onto surface 126 of substrate 120. Ink material 144 can also be printed on surface 126. Ink material 144 can be a UV curable epoxy or other UV curable metal or organic material. Exemplary metals for ink material 144 are Al, Ag, Cu, or other suitable electrically conductive material. Organic material for ink material 144 can be SiO2, Si3N4, SiON, Ta2O5, Al2O3, solder resist, polyimide, BCB, PBO, and other material having similar insulating and structural properties, Ink material 144 can be deposited highly accurately with dispenser 146 or by printing. In FIG. 3*b*, UV light source 148 is positioned above ink material 144 to cure and solidify the ink material. In some cases, UV light source 148 closely follows dispenser 146 to rapidly cure and control the final location ink material 144. FIG. 3*c* shows ink material 144 after deposition and curing. Note that ink material 144 typically spreads out from the droplets to the final cured ink material. The spreading out of ink material droplets may expand to width W of 50.0 micrometers (μm) and high H of 5.0 μm, depending on the number and size of ink material droplets.

Figure 4A:
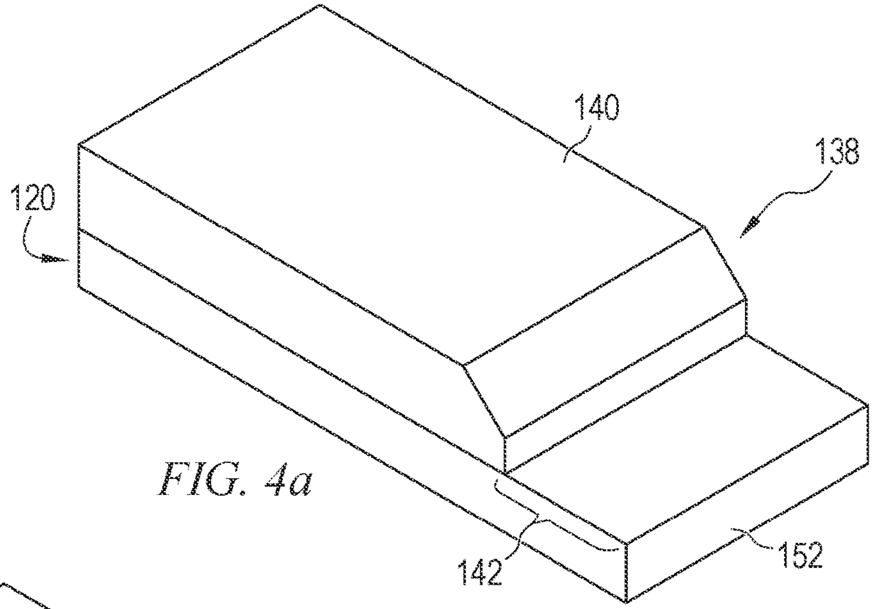
FIGS. 4*a*-4*g* illustrate application of a first row of ink material across the AiP module.
Figure 4B:
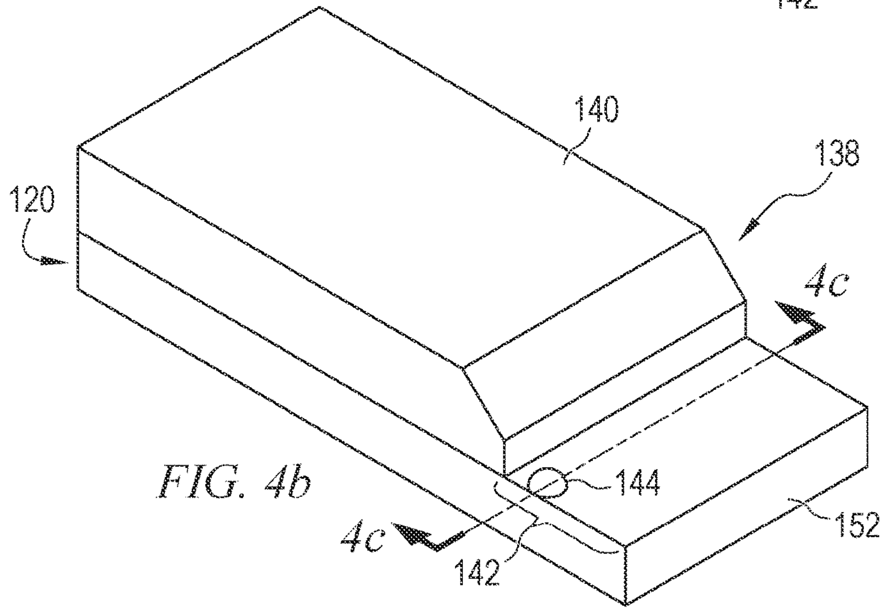
Figure 4C:
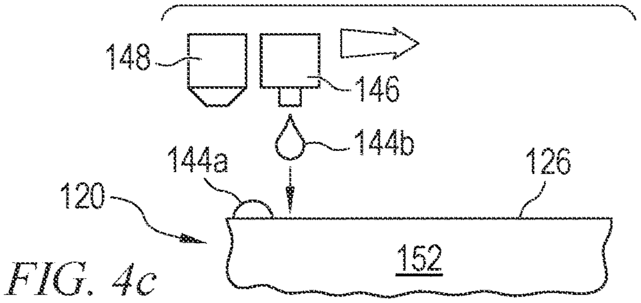
Figure 4D:
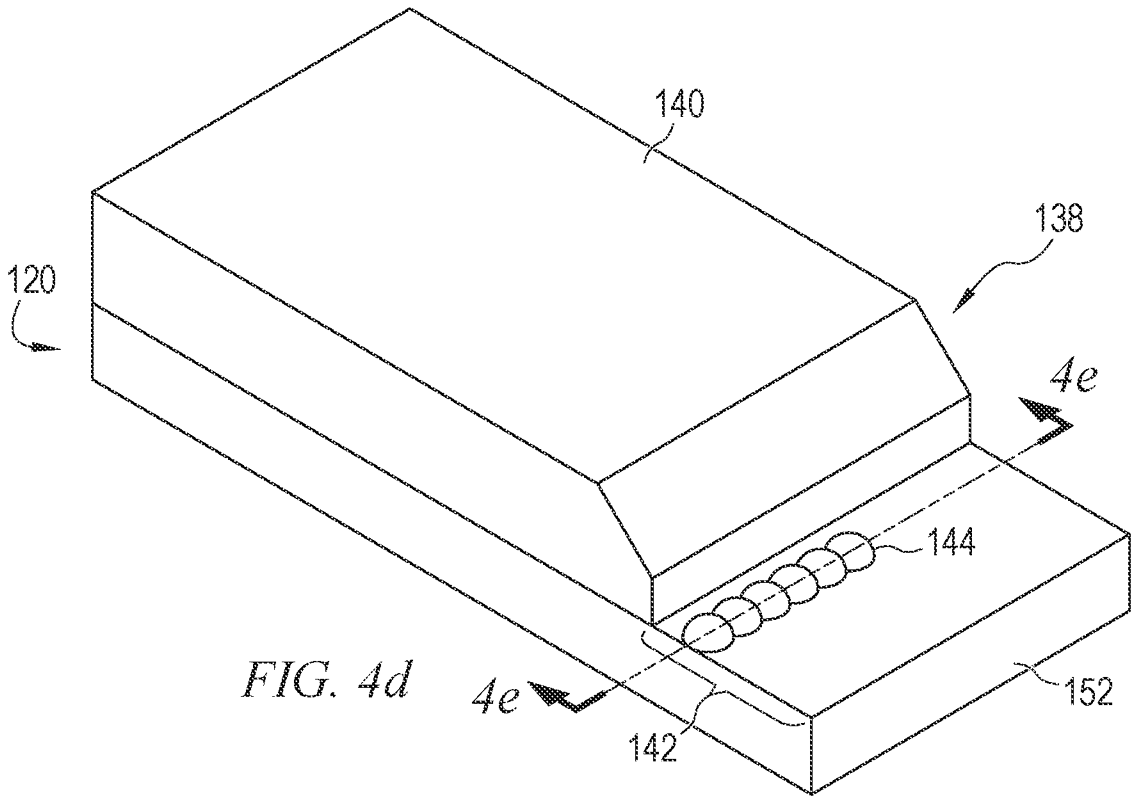
Figure 4E:
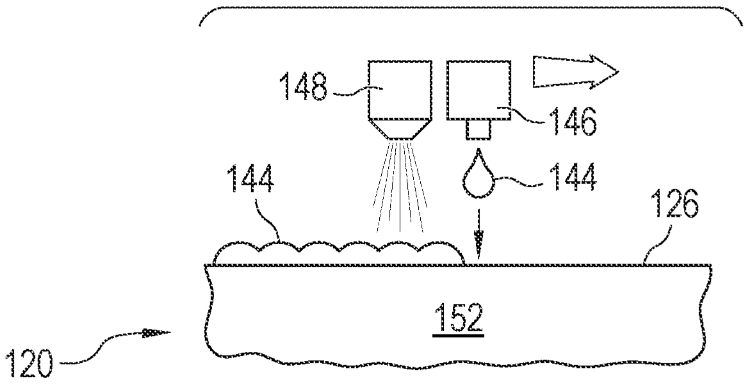
Figure 4F:
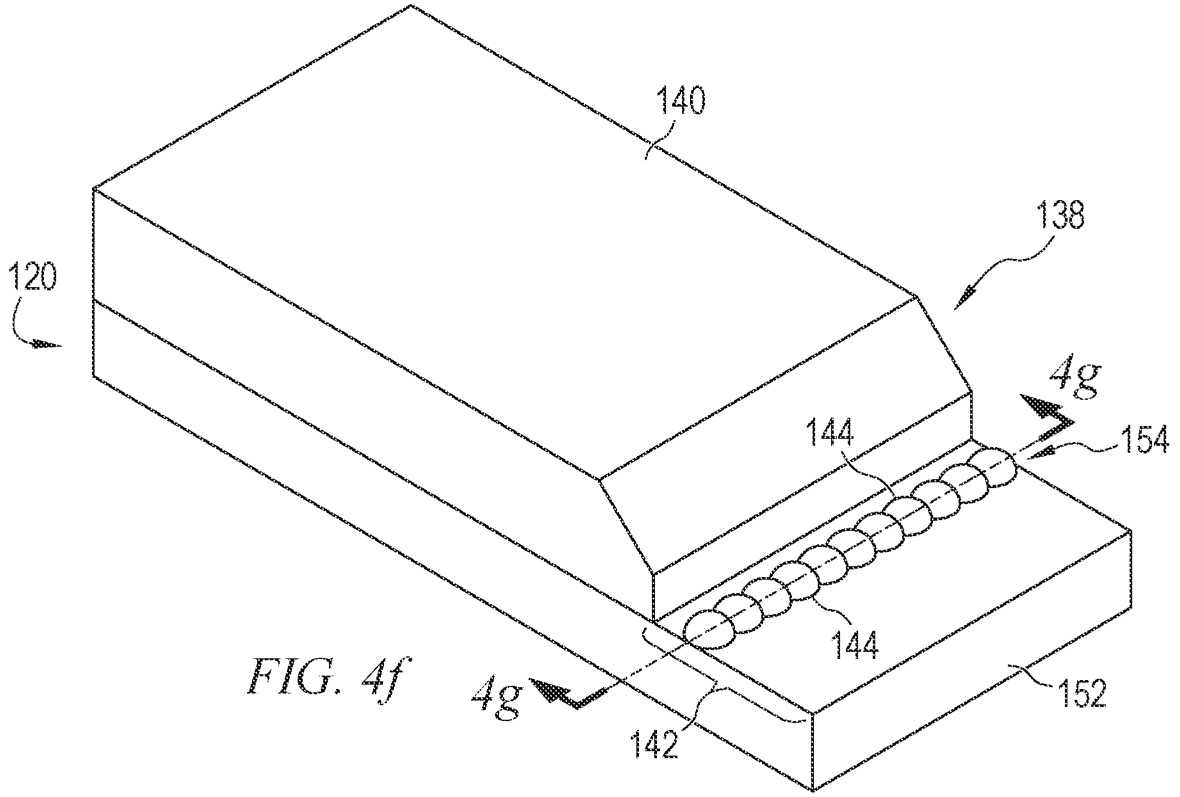
Figure 4G:
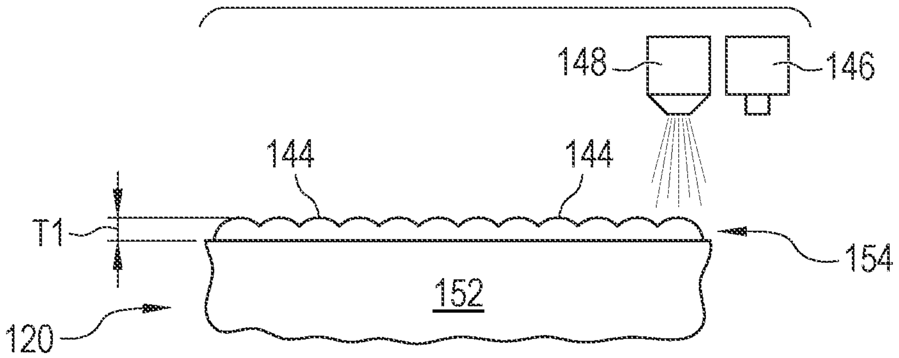

FIG. 4*a* shows assembly 138, prior to depositing ink material 144 in open area 142. In FIG. 4*b*, a first few ink material droplets are deposited in open area 142. FIG. 4*c* is a side view of assembly 138 showing side surface 152 of substrate 120. FIG. 4*c* shows ink material droplet 144*a* landed on surface 126 and ink material droplet 144*b* being released from dispenser 146 to land on surface 126 next to ink material droplet 144*a*. As ink material droplets 144*a*-144*b* spread out, as described in FIGS. 3*a*-3*c*, the ink material droplets contact each other. In FIG. 4*d*, additional ink material droplets are deposited within open area 142, continuing the row or line of ink material. FIG. 4*e* is a side view of assembly 138 showing side surface 152 of substrate 120. FIG. 4*e* shows the row or line of ink material droplets each spreading out to contact the adjacent ink material. Note that UV light source 148 follows dispenser 146 to rapidly cure ink material 144. In FIG. 4*f*, still further ink material droplets are deposited within open area 142, continuing the row or line of ink material. FIG. 4*g* is a side view of assembly 138 showing side surface 152 of substrate 120. FIG. 4*g* shows the row or line of ink material droplets each spreading out to contact the adjacent ink material. In fact, the progression of ink material 144 along a width of substrate 120 in open area 142 forms a wall or dam 154 of ink material with a height T1 of 10.0 μm or less. In one embodiment, T1 is 5.0 μm.

Figure 5A:
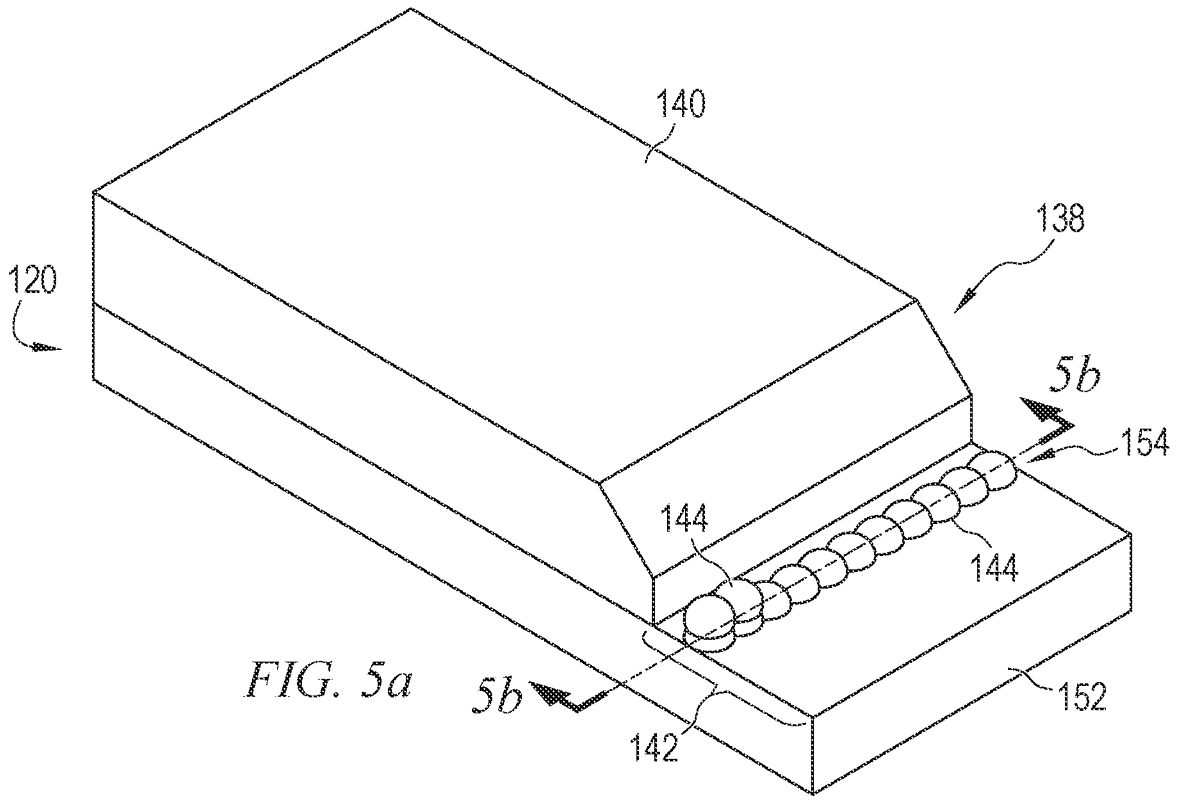
FIGS. 5*a*-5*f* illustrate application of a second row of ink material over the first row of ink material across the AiP module.
Figure 5B:
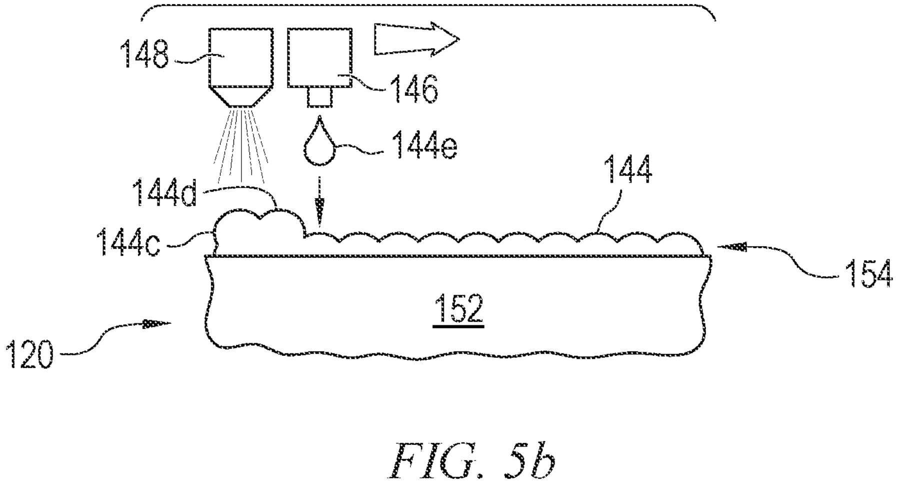
Figure 5C:
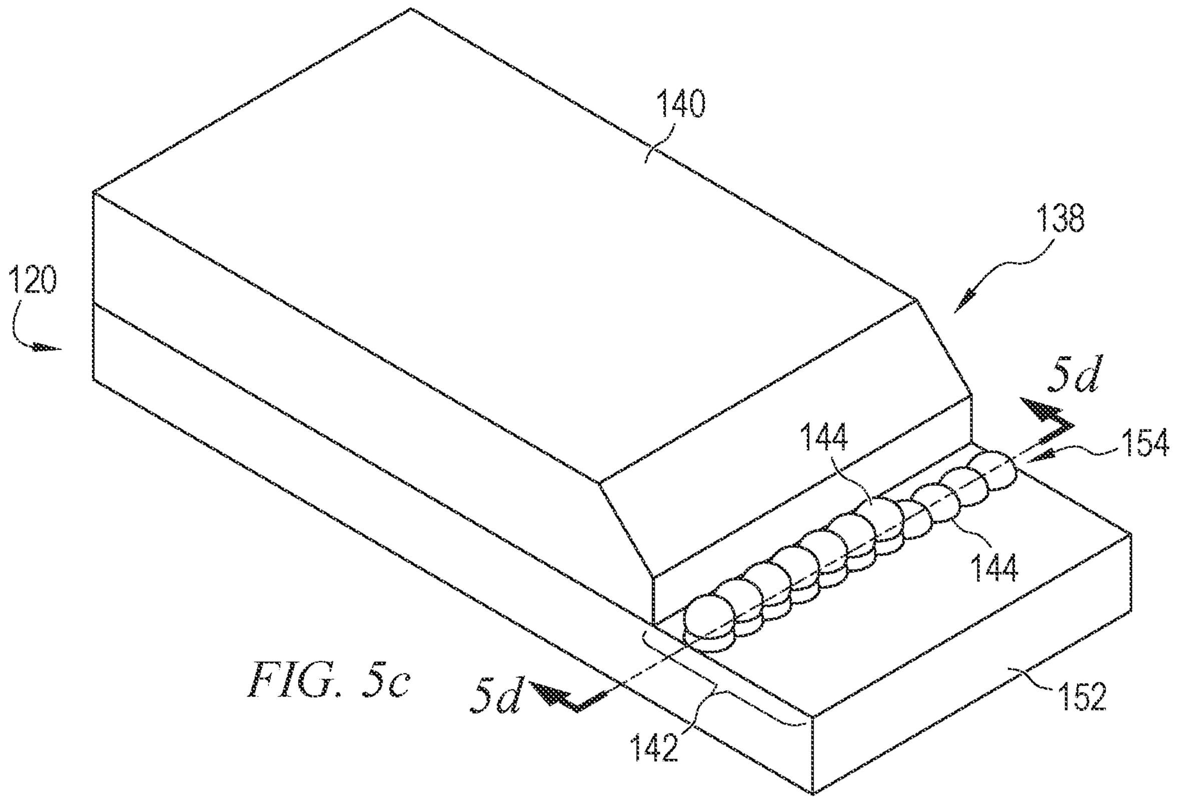
Figure 5D:
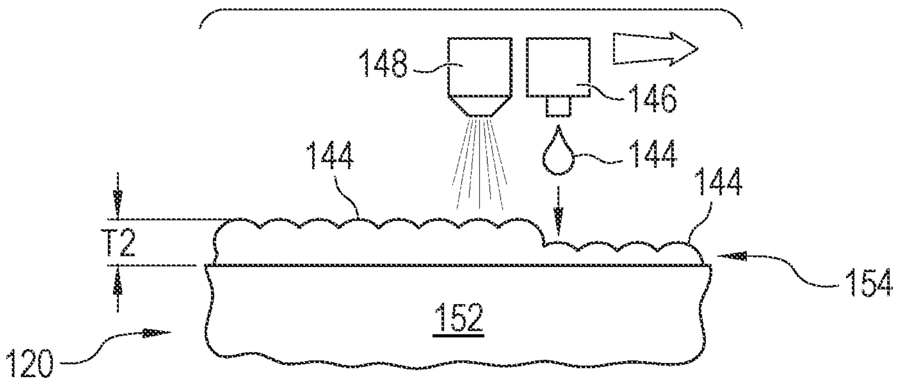
Figure 5E:
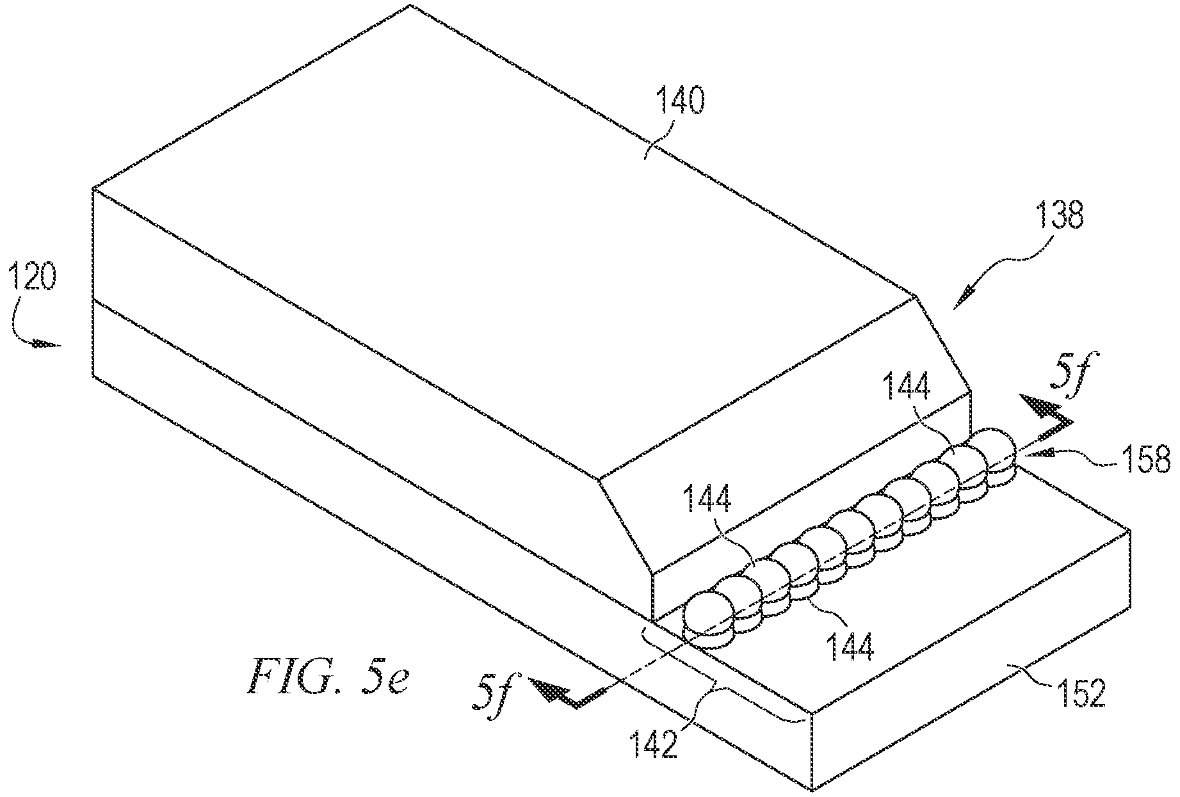
Figure 5F:
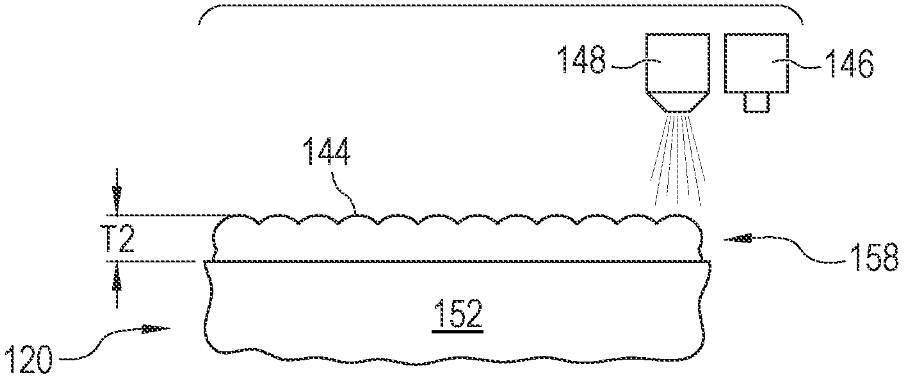

Continuing from FIG. 4*g*, additional ink material 144 can be deposited over wall 154 to extend the height of the wall of ink material. In FIG. 5*a*, a first few ink material droplets are deposited in open area 142 over wall 154 from FIG. 4*g*. FIG. 5*b* is a side view of assembly 138 showing side surface 152 of substrate 120. FIG. 5*b* shows ink material droplet 144*c* and 144*d* landed on wall 154 and ink material droplet 144*e* being released from dispenser 146 to land on wall 154 next to ink material droplet 144*d*. As ink material droplets 144*c*-144*e* spread out, as described in FIGS. 3*a*-3*c*, the ink material droplets contact each other. In FIG. 5*c*, additional ink material droplets are deposited over wall 154, continuing the row or line of ink material. FIG. 5*d* is a side view of assembly 138 showing side surface 152 of substrate 120. FIG. 5*d* shows the row or line of ink material droplets each spreading out to contact the adjacent ink material. Note that UV light source 148 follows dispenser 146 to rapidly cure ink material 144. In FIG. 5*e*, still further ink material droplets are deposited over wall 154, continuing the row or line of ink material. FIG. 5*f* is a side view of assembly 138 showing side surface 152 of substrate 120. FIG. 5*f* shows the row or line of ink material droplets each spreading out to contact the adjacent ink material. In fact, the progression of ink material 144 along a width of substrate 120 over wall 154 in open area 142 extends the height of the wall or dam of ink material from FIG. 4*g*. The height T2 of wall 158 can be 2×T1. Additional rows or lines of ink material 144 can be formed over previous rows or lines of ink material to further extend the height of wall 158.

Figure 6A:
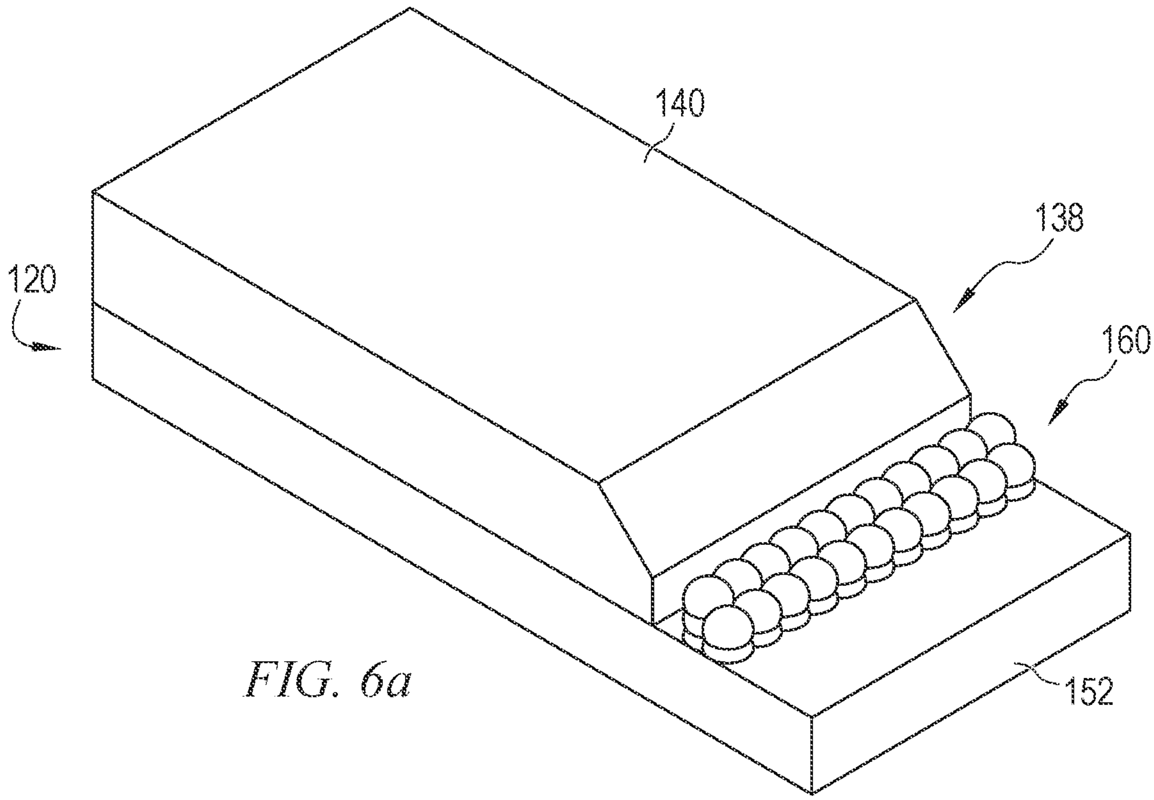
FIGS. 6*a*-6*e* illustrate other embodiments of the ink material across the AiP module.
Figure 6B:
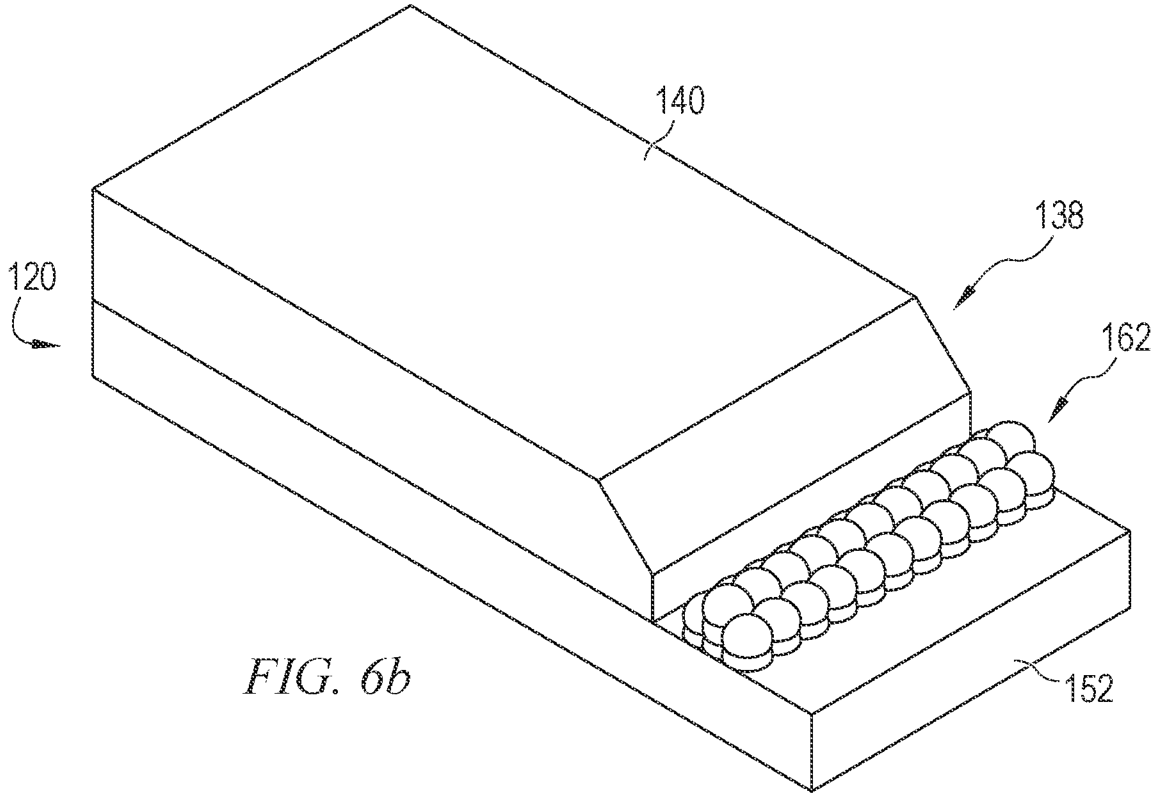
Figure 6C:
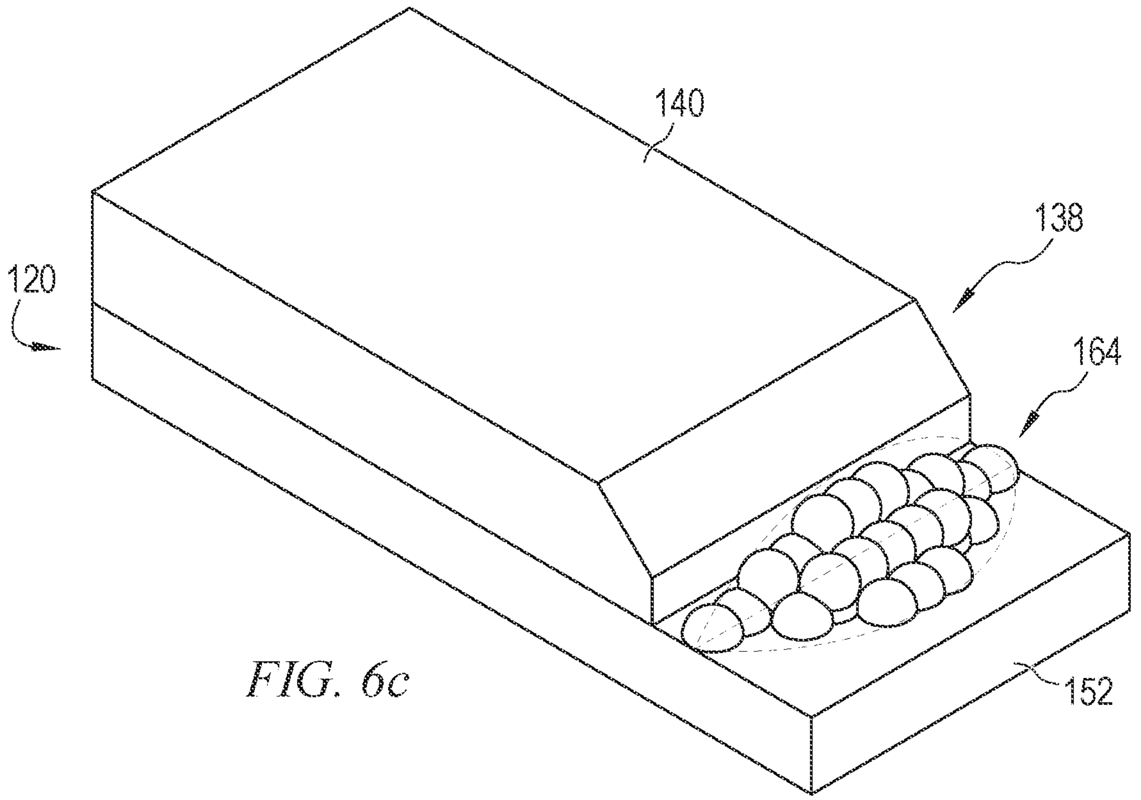
Figure 6D:
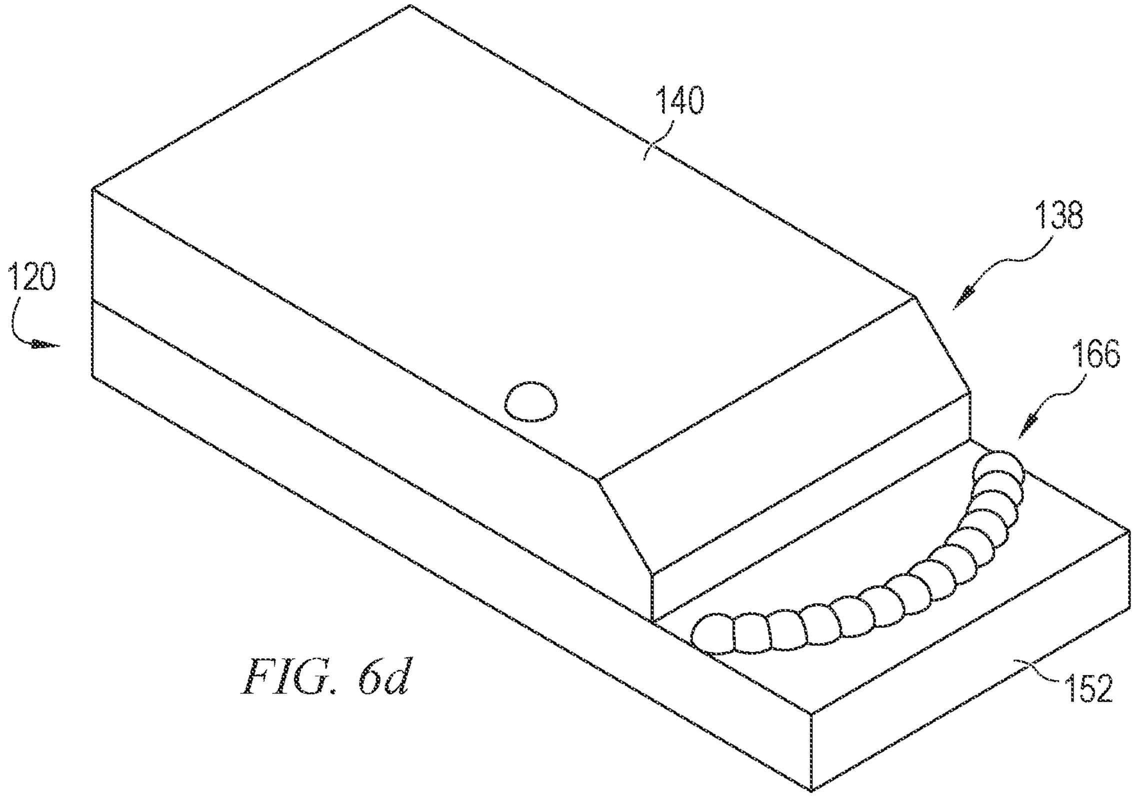
Figure 6E:
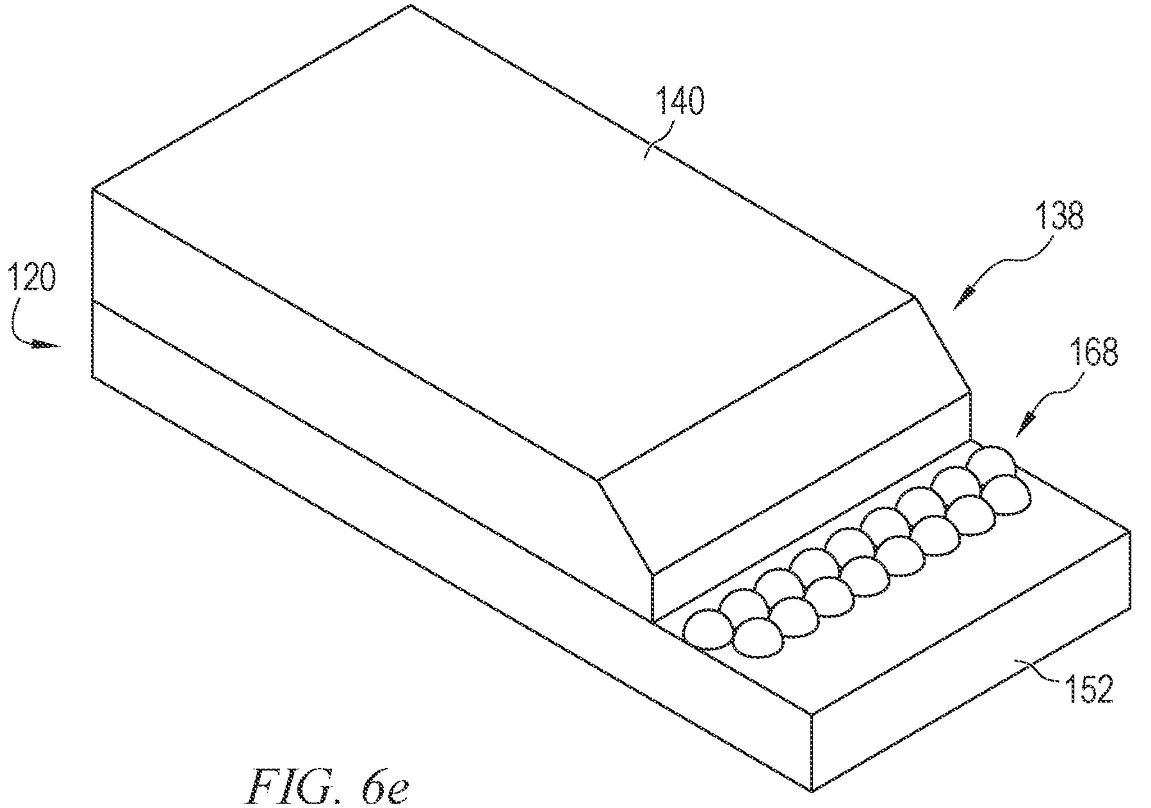

The build-up of wall 154 can take a variety of forms and shapes, by adding rows or lines of ink material to previous layers of ink material. FIG. 5*e* shows a straight row or line wall 158. FIG. 6*a* shows a stepped wall 160 with a first row of ink material 144 stacked three droplets high followed by a second row of ink material stacked two droplets high. The first row of ink material 144 would be higher than the second row of ink material to form the stepped wall 160. FIG. 6*b* shows a convex wall 162 with a first row of ink material 144 stacked two droplets high followed by a second or center row of ink material stacked three droplets high and then a third row of ink material stacked two droplets high. The center row of ink material would be higher than the first row of ink material or the third row of ink material to form the convex wall 162. FIG. 6*c* shows a stepped and convex line wall 164. FIG. 6*d* shows a curved wall 166. FIG. 6*e* shows an offset pattern of separate ink material 168. Given the above examples and dispensing accuracy and rapid curing, ink material 144 can have any form, shape, pattern, line, or drawing.

Electrical components 130*a*-130*b* may contain IPDs that are susceptible to or generate EMI, RFI, harmonic distortion, and inter-device interference. For example, the IPDs contained within electrical components 130*a*-130*b* provide the electrical characteristics needed for high-frequency applications, such as resonators, high-pass filters, low-pass filters, band-pass filters, symmetric Hi-Q resonant transformers, and tuning capacitors. In another embodiment, electrical components 130*a*-130*b* contain digital circuits switching at a high frequency, which could interfere with the operation of IPDs in RF AOP module 176*a*.

Figure 2H:
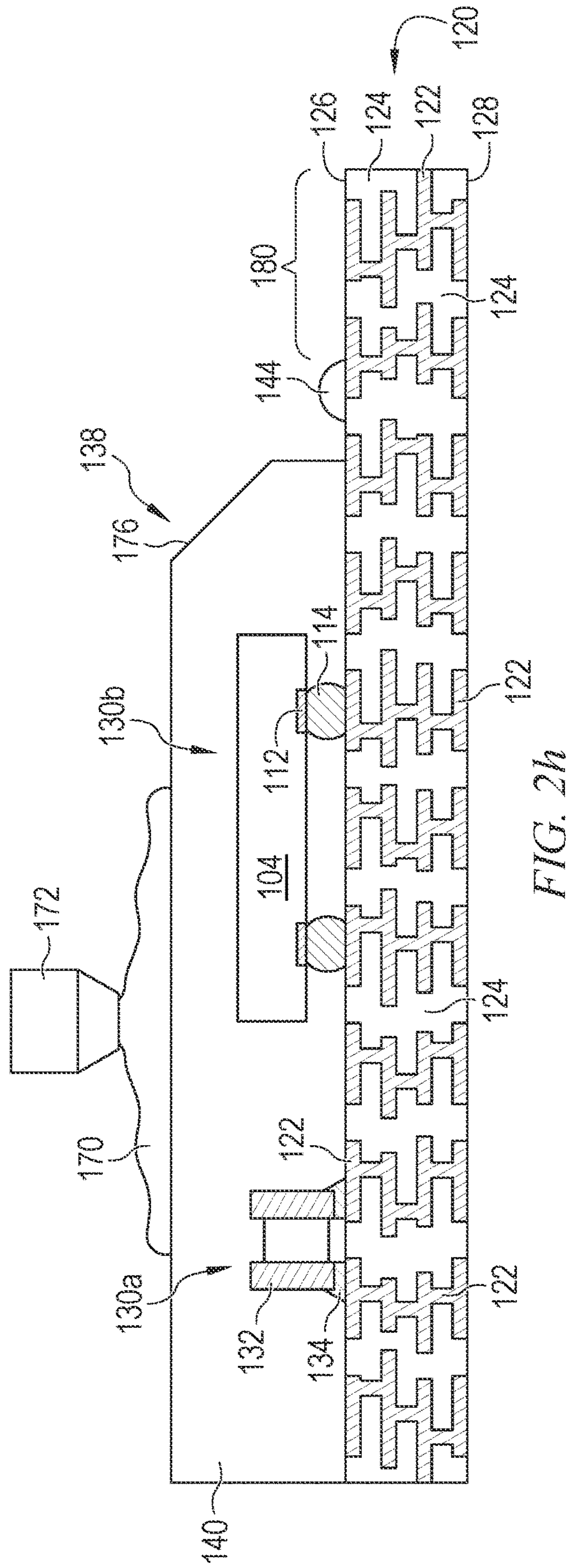

To address EMI, RFI, harmonic distortion, and inter-device interference, shielding material 170 is deposited over encapsulant 140 of assembly 138 with dispenser 172, as shown in FIG. 2*h*. Shielding material 170 has a low viscosity and spreads out, e.g., by spinning assembly 138 to create centrifugal force. FIG. 2*i* is a top view showing shielding material 170 spreading out in the directions of arrows 174 to cover encapsulant 140.

Figure 2J:
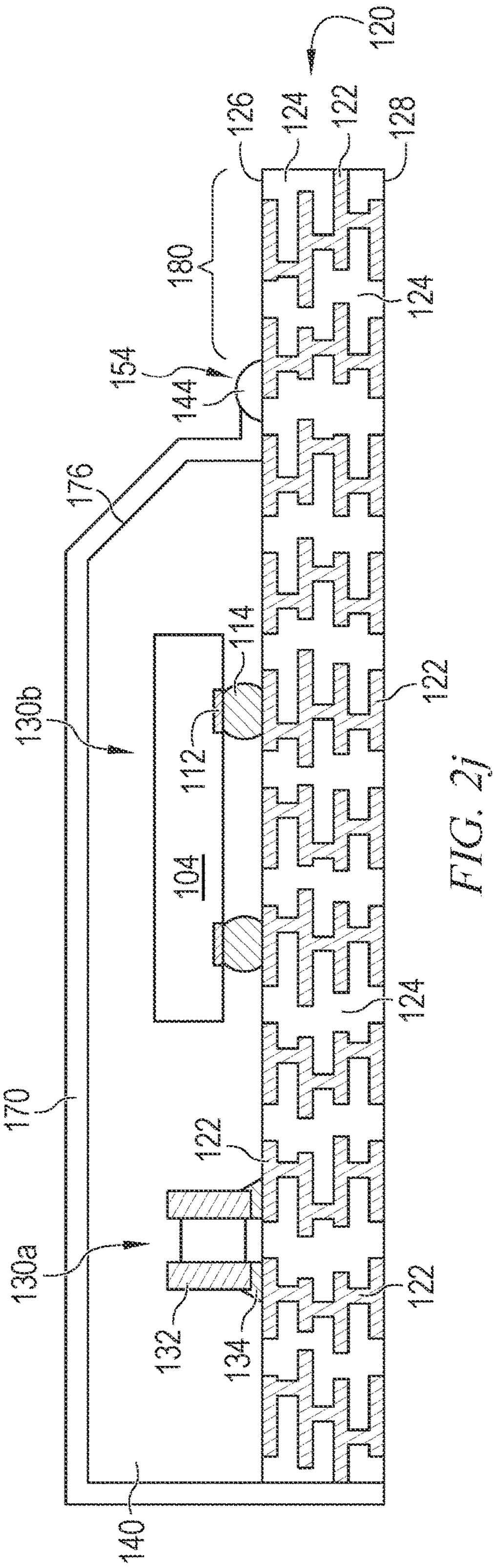
Figure 2I:
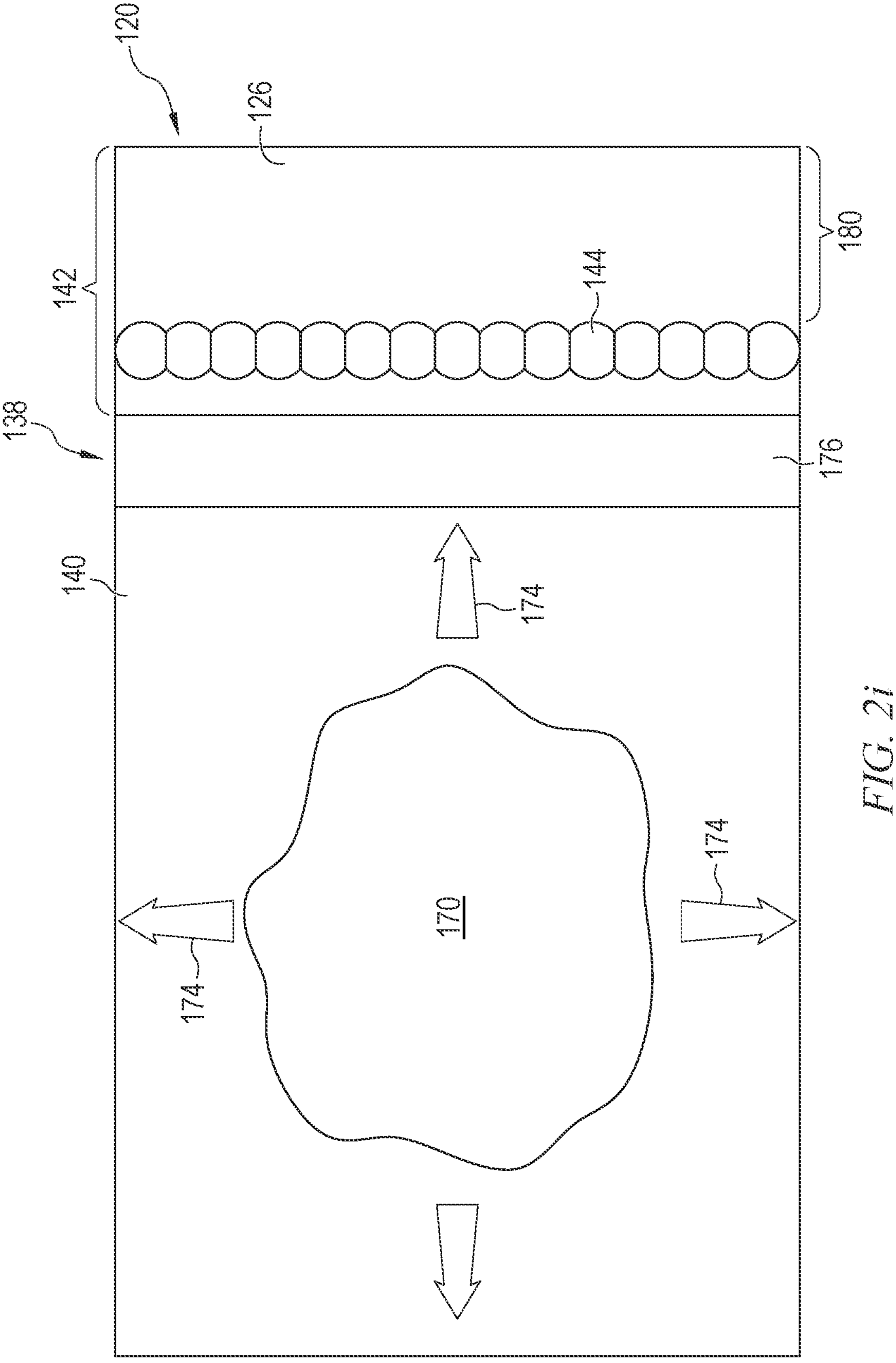

In FIG. 2*j*, shielding material 170 flows down surface 176 of encapsulant 140 and over surface 126 until reaching ink material wall 154. Ink material wall 154 blocks further progression of shielding material 170 beyond the ink material wall. In particular, shielding material 170 does not reach connector mounting site 180 due to ink material wall 154.

The location of ink material wall 154 within open area 142 is easy to control with dispenser 146. Ink material wall 154 can be directly adjacent to encapsulant 170 or spaced further away from the encapsulant. UV light source 148 rapidly cures and solidifies the liquid ink material to control its final location. Ink material wall 154 may leave an overhang of shielding material 170 on surface 126, but the overhang is controllable and manageable.

Figure 2K:
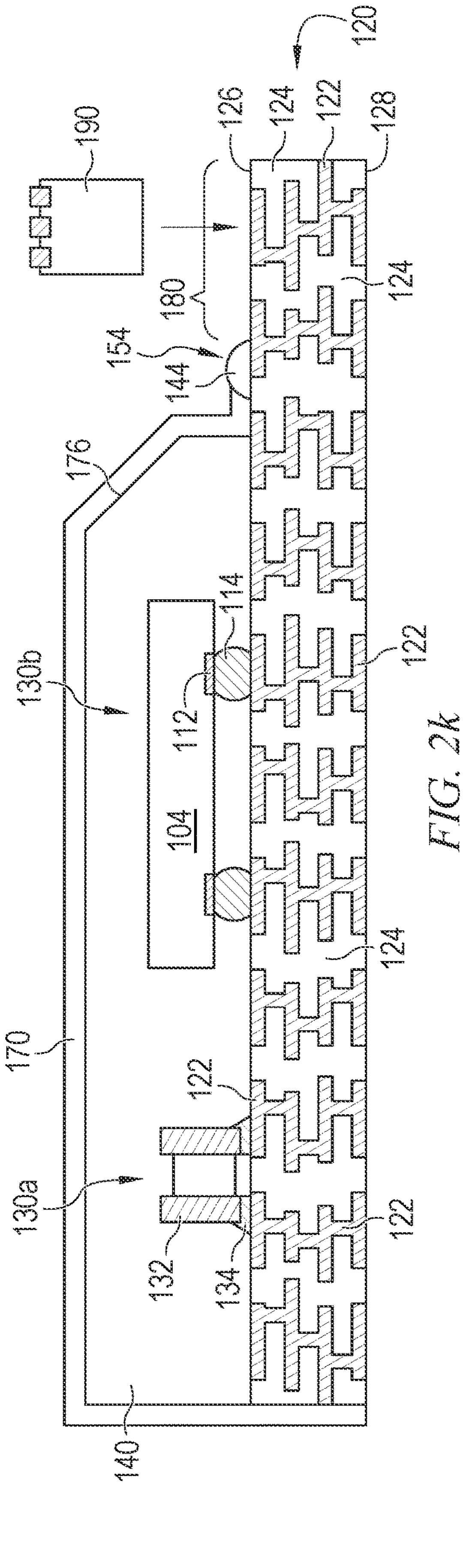
Figure 2L:
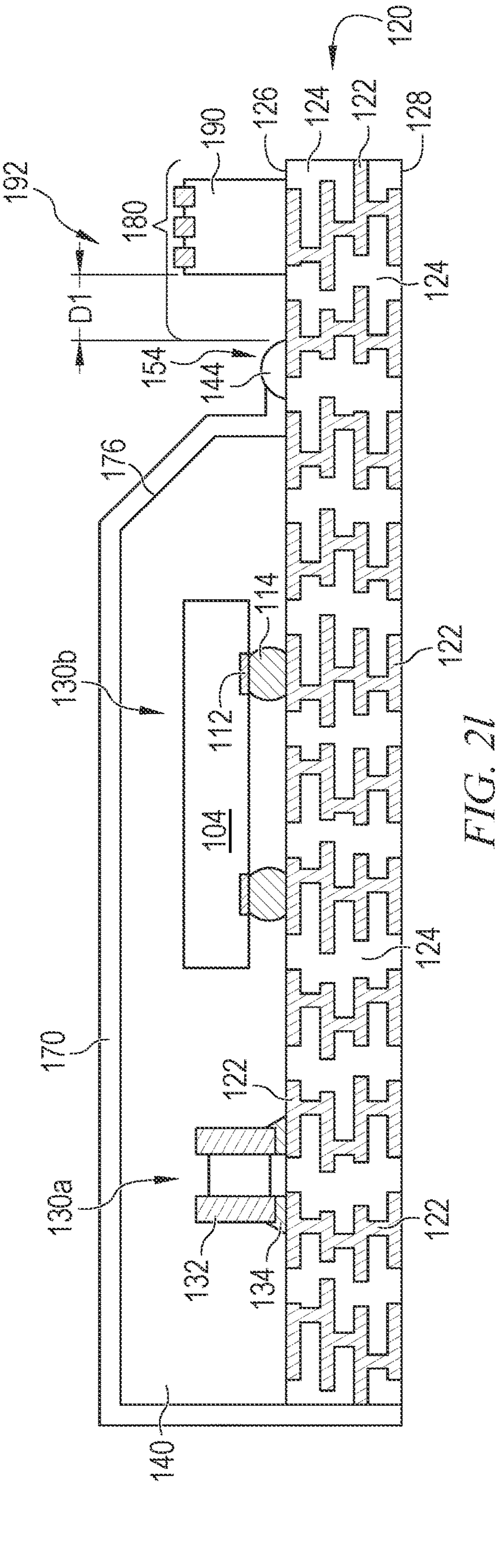

In FIG. 2*k*, electrical connector 190 is disposed over surface 126 of interconnect substrate 120 within connector mounting site 180 using a pick and place operation. Electrical connector 190 is brought into contact with surface 126 of substrate 120. A conductive paste like 134 bonds electrical connector 190 to conductive layer 122. FIG. 2*l* illustrates electrical connector 190 electrically and mechanically connected to conductive layers 122 of substrate 120 within connector mounting site 180, designated as SiP module 192. Connector 190 is disposed over surface 126 of substrate 120 outside ink material wall 154 to avoid contact with shielding material 170. Electrical connector 190 should be a distance D1 of about 17.0 μm from ink material wall 154. With ink material wall 154, there is no electrical shorting between shielding material 170 and connector 190.

Figure 7:
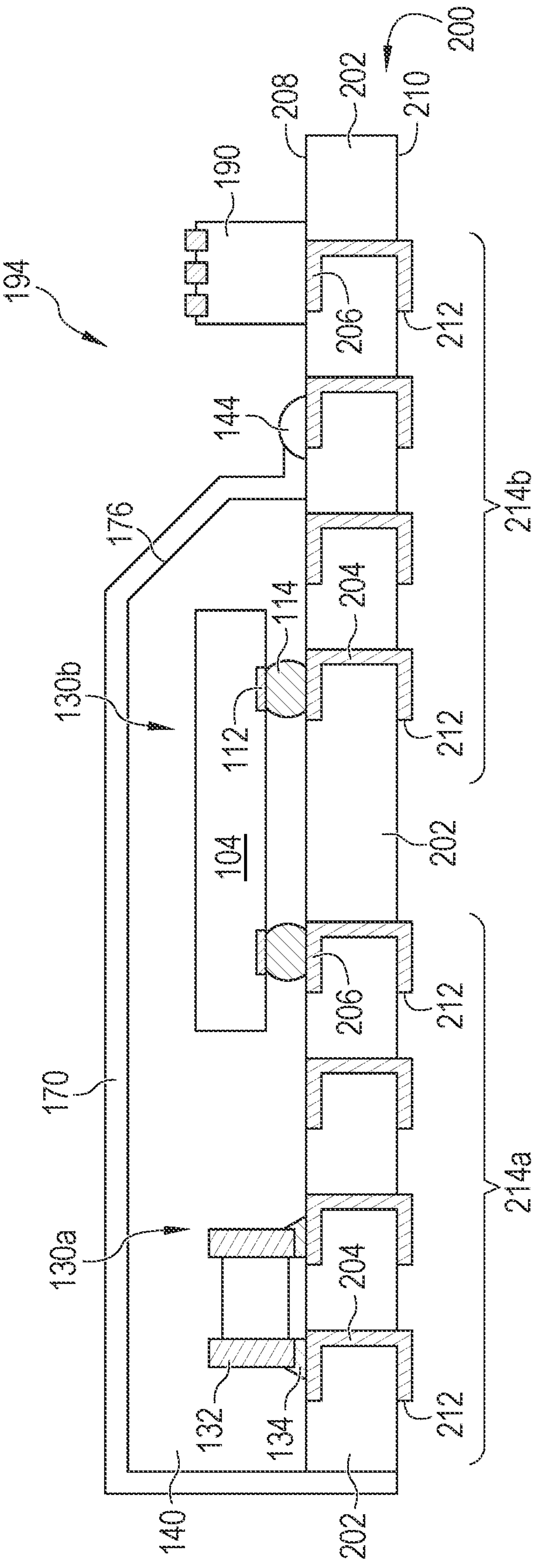

FIG. 7 illustrates electrical components 130*a*-130*b*, encapsulant 140, ink material 144, shielding material 170, and connector 190 applied to AiP substrate 200 to form AiP module 194, using similar processes as described for SiP module 192.

Figure 8:
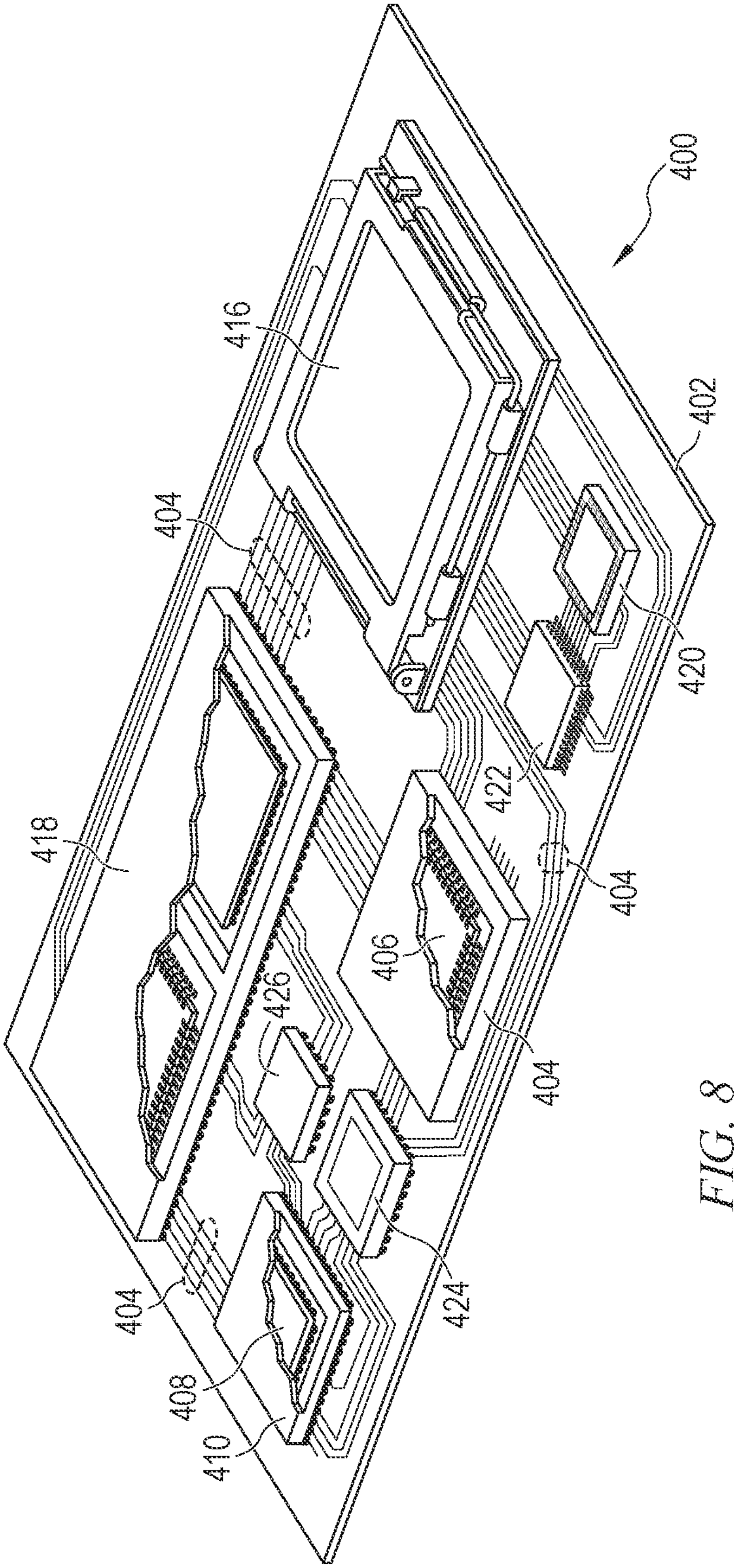

FIG. 8 illustrates electrical device 400 having a chip carrier substrate or PCB 402 with a plurality of semiconductor packages disposed on a surface of PCB 402, including SiP module 192 and AiP module 194. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 8, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a substrate;
an encapsulant deposited over a surface of the substrate;
an ink material deposited over the surface of the substrate;
a shielding material disposed over the encapsulant with the ink material blocking progression of the shielding material; and
an electrical connector disposed over the surface of the substrate outside the ink material to avoid contact with the shielding material.

2. The semiconductor device of claim 1, further including an electrical component disposed over the surface of the substrate.

3. The semiconductor device of claim 1, wherein the ink material is formed as a wall.

4. The semiconductor device of claim 1, wherein a first ink material is deposited on the surface of the substrate and a second ink material is deposited over the first ink material.

5. The semiconductor device of claim 1, wherein the ink material includes a curable epoxy.

6. The semiconductor device of claim 1, further including an antenna formed within the substrate.

7. A semiconductor device, comprising:
a substrate;
an encapsulant deposited over the substrate;
an ink material deposited over the substrate;
a shielding material disposed over the substrate and encapsulant with the ink material blocking progression of the shielding material; and
an electrical connector disposed over the substrate outside the ink material to avoid contact with the shielding material.

8. The semiconductor device of claim 7, further including an electrical component disposed over the substrate.

9. The semiconductor device of claim 7, wherein the ink material is formed as a wall.

10. The semiconductor device of claim 7, wherein a first ink material is deposited on the substrate and a second ink material is deposited over the first ink material.

11. The semiconductor device of claim 7, wherein the ink material includes a curable epoxy.

12. The semiconductor device of claim 7, further including an antenna formed within the substrate.

13. A method of making a semiconductor device, comprising:
providing a substrate;
depositing an encapsulant over a surface of the substrate;
depositing an ink material over the surface of the substrate;
disposing a shielding material over the encapsulant with the ink material blocking progression of the shielding material; and
disposing an electrical connector over the surface of the substrate outside the ink material to avoid contact with the shielding material.

14. The method of claim 13, further including disposing an electrical component disposed over the surface of the substrate.

15. The method of claim 13, further including forming the ink material as a wall.

16. The method of claim 13, further including:
depositing a first ink material on the surface of the substrate; and
depositing a second ink material over the first ink material.

17. The method of claim 13, wherein the ink material includes a curable epoxy.

18. The method of claim 13, further including forming an antenna within the substrate.

19. A method of making a semiconductor device, comprising:
providing a substrate;
depositing an encapsulant over the substrate;
depositing an ink material over the substrate;
disposing a shielding material over the substrate and encapsulant with the ink material blocking progression of the shielding material; and
disposing an electrical connector over the substrate outside the ink material to avoid contact with the shielding material.

20. The method of claim 19, further including disposing an electrical component over the substrate.

21. The method of claim 19, further including forming the ink material as a wall.

22. The method of claim 19, further including:
depositing a first ink material on the substrate; and
depositing a second ink material over the first ink material.

23. The method of claim 19, wherein the ink material includes a curable epoxy.

* * * * *